United States Patent
Wang

(10) Patent No.: US 8,807,202 B2
(45) Date of Patent: Aug. 19, 2014

(54) HEAT DISSIPATION DEVICE

(75) Inventor: Xiang Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 351 days.

(21) Appl. No.: 13/270,236

(22) Filed: Oct. 11, 2011

(65) Prior Publication Data

US 2013/0043001 A1 Feb. 21, 2013

(30) Foreign Application Priority Data

Aug. 16, 2011 (CN) .......................... 2011 1 0234415

(51) Int. Cl.
*F28F 7/00* (2006.01)
*H05K 7/20* (2006.01)

(52) U.S. Cl.
USPC .......................................... 165/79; 165/80.3

(58) Field of Classification Search
CPC .. H05K 7/20154; H05K 1/0204; H01L 24/72; H01L 23/32; H01L 23/40
USPC .............. 165/80.3, 185, 67, 76, 79; 361/704, 361/707, 710; 257/719, 722; 174/16.3
See application file for complete search history.

(56) References Cited

U.S. PATENT DOCUMENTS

| | | | | |
|---|---|---|---|---|
| 5,353,193 A * | 10/1994 | Chia et al. | ...................... | 361/704 |
| 5,566,052 A * | 10/1996 | Hughes | .......................... | 361/704 |
| 5,596,485 A * | 1/1997 | Glenn et al. | .................. | 361/703 |
| 5,708,564 A * | 1/1998 | Lin | .............................. | 361/704 |
| 6,386,274 B1 * | 5/2002 | Wang et al. | .................. | 165/80.3 |
| 6,543,522 B1 * | 4/2003 | Hegde | ......................... | 165/80.3 |
| 6,828,673 B2 * | 12/2004 | Ficorilli et al. | ............... | 257/707 |
| 7,196,905 B2 * | 3/2007 | Tanaka et al. | ................. | 361/704 |
| 7,362,578 B2 * | 4/2008 | Hornung | ....................... | 361/704 |
| 2005/0265000 A1 | 12/2005 | He | | |

FOREIGN PATENT DOCUMENTS

| | | |
|---|---|---|
| CN | 2490699 Y | 5/2002 |
| CN | 2706868 Y | 6/2005 |
| CN | 201221544 Y | 4/2009 |

* cited by examiner

*Primary Examiner* — Tho V Duong
(74) *Attorney, Agent, or Firm* — Novak Druce Connolly Bove + Quigg LLP

(57) ABSTRACT

A heat dissipation device includes a fixing bracket and a heat sink connected to the fixing bracket in a horizontal rotation manner. The fixing bracket includes a fixing plate defining a through hole. Two blocks extend up from a top of the fixing plate around the through hole. A latching portion extends towards the through hole from a top of an inner side of each block. The heat sink includes a bottom plate, a number of fins extending up from a top of the bottom plate, and a base extending down from a bottom of the bottom plate. The base is received in the through hole of the fixing bracket and includes a main body, and two flanges extending outwards from a bottom circumference of the main body, to engage with bottoms of the latching portions, respectively.

4 Claims, 4 Drawing Sheets

HEAT DISSIPATION DEVICE

BACKGROUND

1. Technical Field

The present disclosure relates to a heat dissipation device.

2. Description of Related Art

For dissipating heat, a heat sink is generally mounted on a heat generating component and fixed to a motherboard with four screws or a press bar. However, the heat sink is apt to be tilted during installation and in use. Therefore, the heat sink may not contact the heat generating component, which will weaken the heat dissipating effect.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
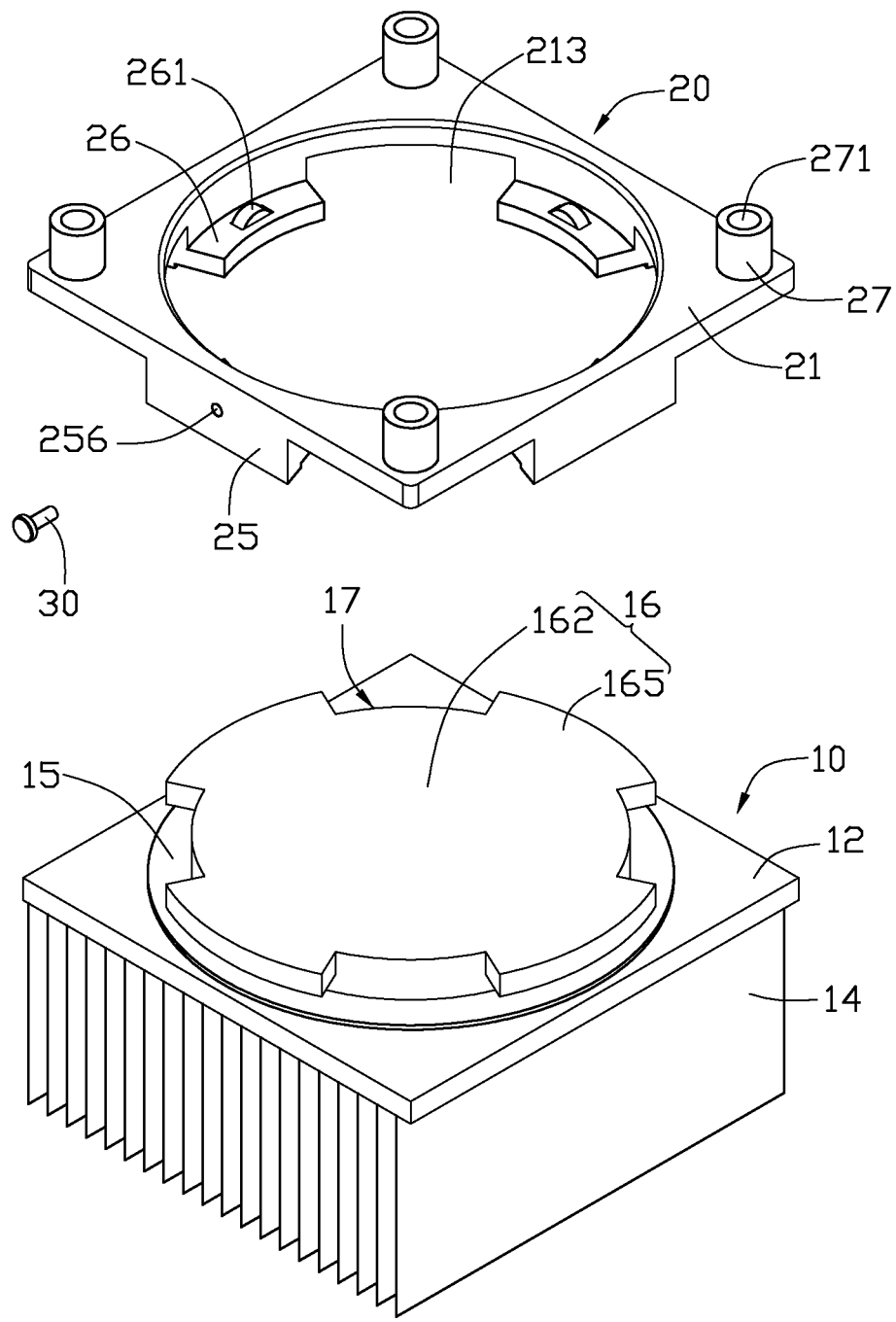
FIG. 1 is an exploded, isometric view of an exemplary embodiment of a heat dissipation device.
Figure 2:
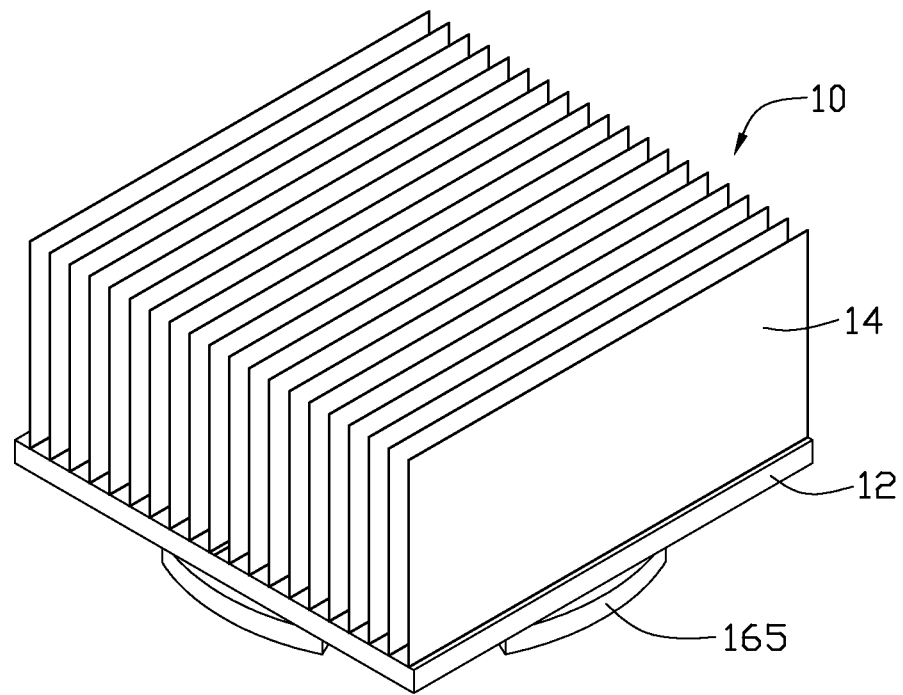
FIG. 2 is an inverted view of FIG. 1.
Figure 2:
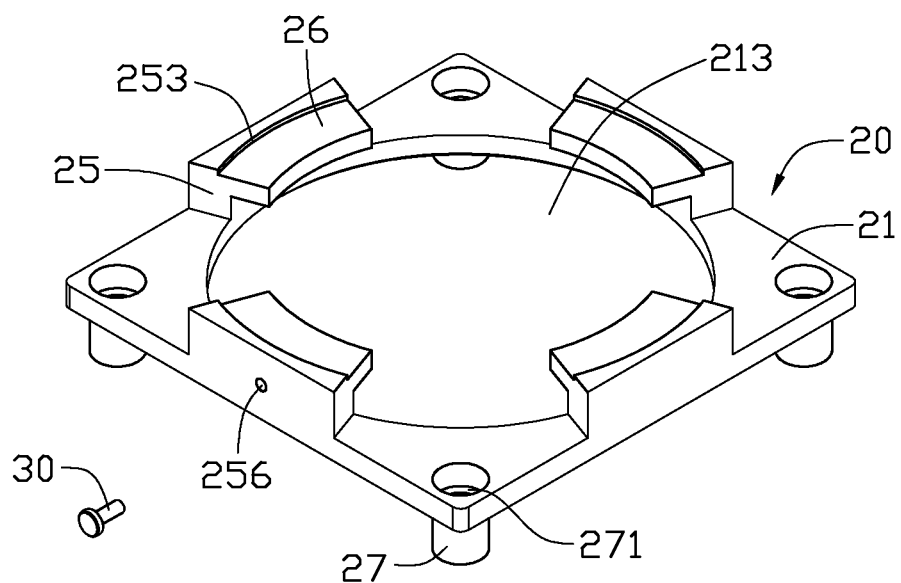

Referring to FIGS. 1 and 2, an exemplary embodiment of a heat dissipation device includes a heat sink 10, a fixing bracket 20, and a fastener 30.

The heat sink 10 includes a bottom plate 12, a plurality of fins 14 extending up from the top of the bottom plate 12, a circular connecting plate 15 formed on the bottom of the bottom plate 12, and a base 16 extending down from the bottom of the connecting plate 15. The base 16 includes a circular main body 162, and four spaced flanges 165 extending outwards from the bottom circumference of the main body 162. A cutout 17 is defined between every two adjacent flanges 165.

The fixing bracket 20 includes a fixing plate 21, and four feet 27 extending down from the bottom of the fixing plate 21. A circular through hole 213 is defined in a middle of the fixing plate 21. Four spaced blocks 25 extend up from the top of the fixing plate 21 around the through hole 213. A latching portion 26 extends towards the through hole 213 from the top of the inner side of each block 25 facing the through hole 213. An arched resilient tab 261 is formed on a middle of the bottom of each latching portion 26. A recess 253 is defined in the tops of each block 25 and the corresponding latching portion 26. A positioning hole 256 is defined in one of the blocks 25, with opposite ends extending through the inner side and the outer side of the block 25, respectively. A fixing hole 271 is defined in each foot 27, with the top of the fixing hole 271 extending through the fixing plate 21.

Figure 3:
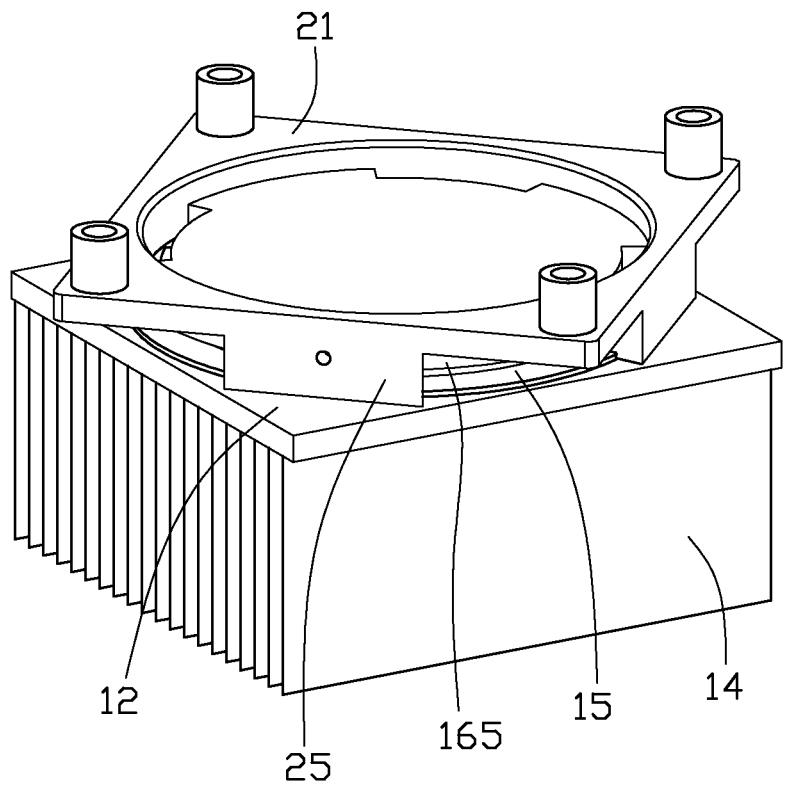
FIG. 3 is an assembled, isometric view of FIG. 1.
Figure 4:
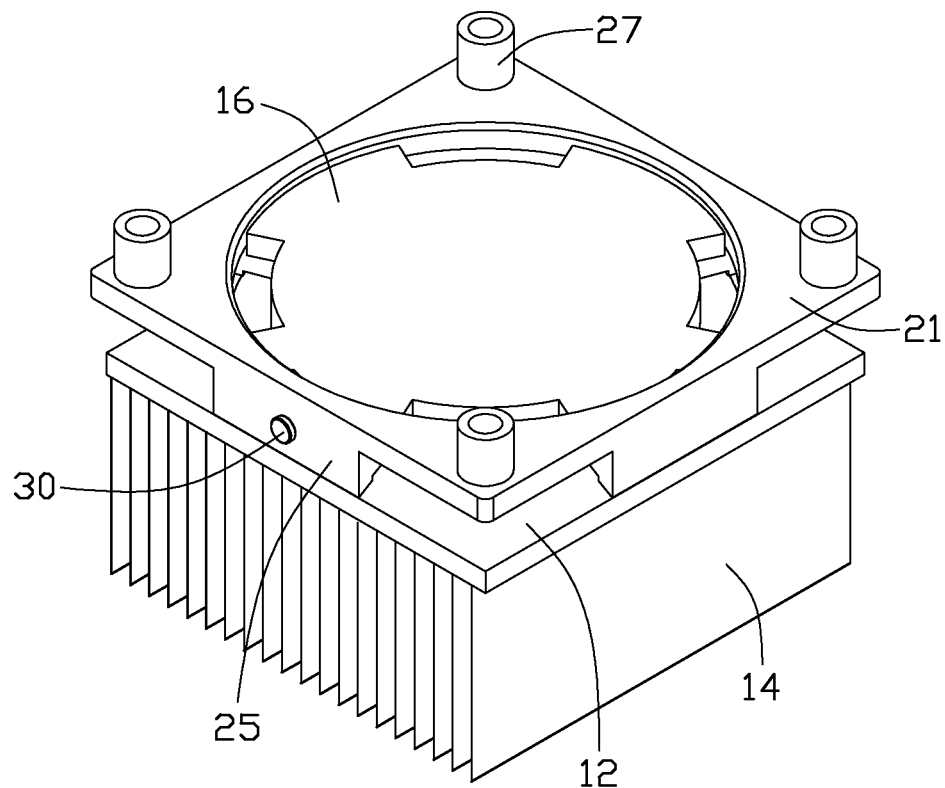
FIG. 4 is similar to FIG. 3, but shows the heat dissipation device in a locked status.

Referring to FIGS. 3 and 4, in use, four screws are respectively extended through the fixing holes 271 and engage in four corresponding threaded holes of a motherboard, to fix the fixing bracket 20 to the motherboard, and to allow a heat generating component on the motherboard to align with or be partially received in the through hole 213. The heat sink 10 is placed above the fixing bracket 20, to allow the cutouts 17 to align with the latching portions 26, respectively. The heat sink 10 is moved down, and the latching portions 26 are respectively extended through the cutouts 17. The heat sink 10 is rotated horizontally, to allow the latching portions 26 to be completely sandwiched between the corresponding flanges 165 and the connecting plate 15. The flanges 165 engage with the bottoms of the corresponding latching portions 26, and deform the corresponding resilient tabs 261 upwards. The connecting plate 15 engages in the recesses 253. The fastener 30 is extended through the positioning hole 256 and tightly abuts against a lateral side of the corresponding one of the flanges 165. Thereby, the heat sink 10 is fixed to the fixing bracket 20, with the bottom of the base 16 completely contacting the heat generating component.

In the embodiment, the heat sink 10 is connected to the fixing bracket 20 in a horizontal rotation manner, which can prevent the heat sink 10 from being tilted and deficiently contacting a corresponding heat generating component during installation and in use. The resilient tabs 261 are sandwiched between the latching portions 26 and the corresponding flanges 165, which can prevent the heat sink 10 from loosening due to manufacturing tolerance of the heat sink 10 and the fixing bracket 20.

Even though numerous characteristics and advantages of the embodiments have been set forth in the foregoing description, together with details of the structure and the functions of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A heat dissipation device, comprising:
   a fixing bracket comprising a fixing plate defining a through hole, at least two blocks extending up from a top of the fixing plate around the through hole, and a latching portion extending towards the through hole from a top of an inner side of each block facing the through hole; and
   a heat sink connected to the fixing bracket in a horizontal rotation manner, the heat sink comprising a bottom plate, a plurality of fins extending up from a top of the bottom plate, and a base extending down from a bottom of the bottom plate, wherein the base is received in the through hole of the fixing bracket and comprises a main body, and at least two flanges extending outwards from a bottom circumference of the main body to engage with bottoms of the latching portions, respectively, and wherein a cutout is defined between every two adjacent ones of the flanges, when the heat sink is rotated and the latching portions align with the cutouts, the latching portions are disengaged from the flanges, and further wherein an arched resilient tab is formed on a bottom of each latching portion.

2. The heat dissipation device of claim 1, wherein a positioning hole is defined in one of the blocks, with opposite ends of the positioning hole extending through the inner side and an outer side of the block, respectively, when the latching portions engage with the corresponding flanges, a fastener is capable of extending through the positioning hole and tightly abutting against a lateral side of the corresponding flange.

3. The heat dissipation device of claim 1, wherein a connecting plate is formed on the bottom of the bottom plate, and the base extends down from a bottom of the connecting plate, a recess is defined in tops of each block and the corresponding latching portion, for engaging with the connecting plate.

4. The heat dissipation device of claim 1, wherein a plurality of feet is formed on the bottom of the fixing plate, a fixing hole is defined in each of the feet, with a top of the fixing hole extending through the fixing plate.

* * * * *